United States Patent [19]

Slominski

[11] Patent Number: 4,671,968
[45] Date of Patent: Jun. 9, 1987

[54] METHOD FOR ELECTROLESS DEPOSITION OF COPPER ON CONDUCTIVE SURFACES AND ON SUBSTRATES CONTAINING CONDUCTIVE SURFACES

[75] Inventor: Leo J. Slominski, Bristol, Conn.

[73] Assignee: MacDermid, Incorporated, Waterbury, Conn.

[21] Appl. No.: 893,445

[22] Filed: Aug. 6, 1986

Related U.S. Application Data

[63] Continuation of Ser. No. 718,353, Apr. 1, 1985, abandoned.

[51] Int. Cl.[4] .............................................. C23C 18/40
[52] U.S. Cl. ........................................ 427/12; 427/97;
427/98; 427/305; 427/437; 427/443.1
[58] Field of Search ...................... 427/12, 97, 98, 305,
427/437, 443.1

[56] References Cited

U.S. PATENT DOCUMENTS

| 2,644,787 | 7/1953 | Bonn . |
| 3,243,361 | 3/1966 | Clark . |
| 3,264,199 | 8/1966 | Fassell . |
| 3,303,111 | 2/1967 | Peach . |
| 3,485,725 | 12/1969 | Koritzky . |
| 4,209,331 | 6/1980 | Kukanskis . |
| 4,265,943 | 5/1981 | Goldstein ............................. 427/437 |
| 4,391,841 | 7/1983 | Zeblisky ............................... 427/437 |
| 4,459,184 | 7/1984 | Kukanskis . |
| 4,478,690 | 10/1984 | Scholtens ............................. 427/12 |
| 4,482,596 | 11/1984 | Gulla . |

FOREIGN PATENT DOCUMENTS 1222969 2/1971 United Kingdom .

Primary Examiner—John D. Smith
Attorney, Agent, or Firm—St.Onge Steward Johnston & Reens

[57] ABSTRACT

A method of electrolessly depositing copper onto a suitably prepared substrate surface is disclosed in which passivity to an otherwise autocatalytic electroless depositing solution is cured by application of a cathodic current for a brief period of time until autocatalytic deposition commences. The method is suitable for coating surfaces which per se are passive to the depositing solution as well as for coating surfaces which normally are receptive to the autocatalytic deposition and which have been so coated up to a certain point where interruption of the plating thereafter renders the surface passive to further deposition.

10 Claims, 1 Drawing Figure

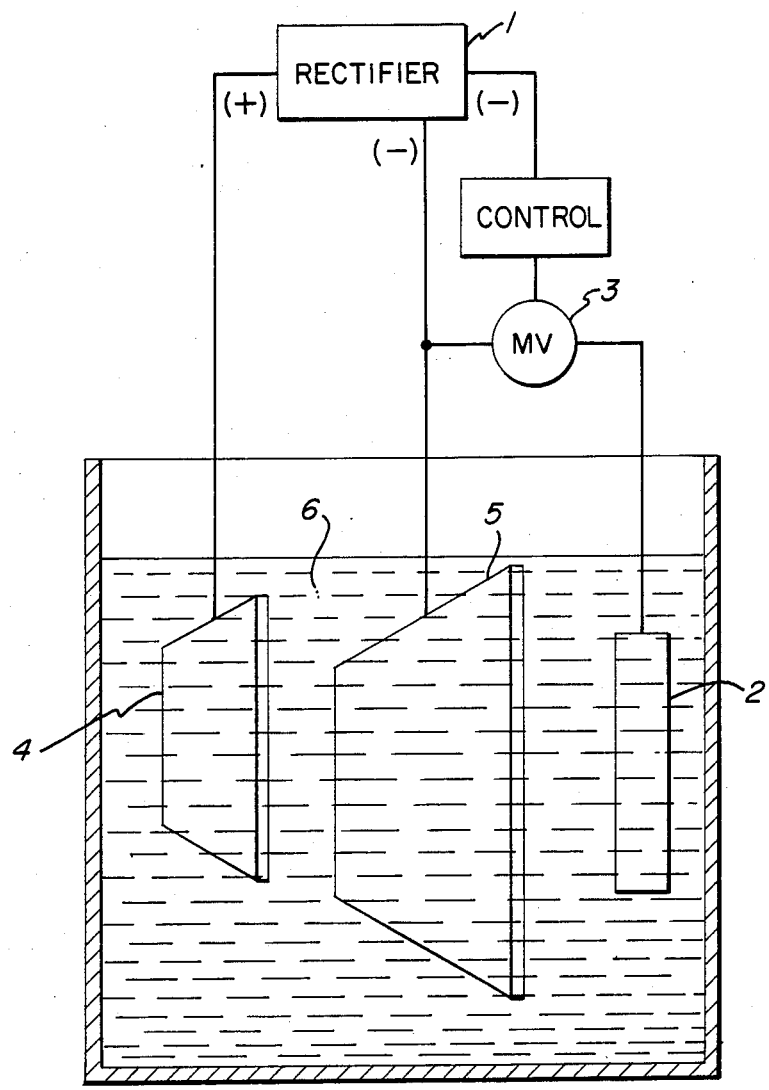

METHOD FOR ELECTROLESS DEPOSITION OF COPPER ON CONDUCTIVE SURFACES AND ON SUBSTRATES CONTAINING CONDUCTIVE SURFACES

This is a continuation of co-pending application Ser. No. 718,353, filed on Apr. 1, 1985, now abandoned.

BACKGROUND OF THE INVENTION

The present invention relates to the electroless deposition of copper onto a substrate having a conductive surface and, more particularly, to the electroless deposition of copper, in the presence of nickel or cobalt ions and using a hypophosphite reducing agent, onto a substrate having a conductive surface.

The electroless deposition of metals such as nickel or copper or alloys of these metals with other elements onto suitably prepared substrate surfaces, both conductive and non-conductive, has been known and practiced for some time now. The most commonly practiced method of electroless deposition involves chemical reduction, i.e., wherein deposition takes place by the action of a reducing agent on dissolved metal in the presence of a substrate composed of an inherently catalytic material or a substrate catalyzed by some form of pretreatment.

In the electroless deposition of nickel or nickel alloys via electroless deposition by chemical reduction, the electroless depositing solution generally contains a source of nickel ions, a reducing agent such as a hypophosphite compound, a complexing agent to prevent precipitation of metal ions from solution and an acid or alkaline pH adjusting compound. Electroless nickel solutions of this type are "autocatalytic", i.e., they result in deposition of a coating which itself is catalytic to continued deposition. This permits continuous depositing of nickel or nickel alloy to produce coatings of considerable thickness so long as the concentrations of required ingredients in the electroless solution are maintained.

It was recognized that, for many applications, the use of copper as a conductive coating on a substrate would be preferable or superior to nickel or nickel alloy coatings. Electroless copper depositing solutions relying upon chemical reduction processes were developed which were autocatalytic and which relied upon formaldehyde as the reducing agent. The use of formaldehyde, however, is attendant with a number of problems, not the least of which relate to the potential toxicity of its vapors. Nevertheless, the use of highly alkaline formaldehye electroless copper solutions was essentially the standard in commercially practiced electroless depositing up until the late 1970's, and still is in substantial use at the present time.

A significant advance in the art was achieved in U.S. Pat. No. 4,209,331 wherein a formaldehyde-free electroless copper depositing solution and process employing a hypophosphite reducing agent was disclosed in which the pH of the solution is tailored to the particular complexing agent employed.

The electroless copper solutions disclosed in U.S. Pat. No. 4,209,331, in contrast to the prior formaldehyde-based solutions, are non-autocatalytic, i.e., once the substrate is coated with a thin layer of the deposited copper metal, the deposition reaction stops or becomes uneconomically slow. To a very large degree this can be highly advantageous since another consequence of employing non-autocatalytic solutions is that the depositing can be restricted only to those areas of the substrate or work-piece which have been suitably pretreated (i.e., catalyzed). In contrast, the autocatalytic formaldehyde baths often deposit copper metal on every surface, e.g., tank walls, filters and associated equipment. Nevertheless, it was perceived that in some situations it would be desirable to deposit thicker coatings of copper on the substrate than could be achieved using the process and non-autocatalytic solutions of U.S. Pat. No. 4,209,331.

One method for achieving this result is set forth in U.S. Pat. No. 4,459,184. There, a non-autocatalytic electroless copper solution using hypophosphite as a reducing agent, i.e., as set forth in U.S. Pat. No. 4,209,331, is used to deposit a thin layer of copper metal on a suitably catalyzed substrate surface. At that point, which would otherwise be the termination point of the process for these non-autocatalytic solutions, an electrical current of negative potential is applied to the work-piece with the result that additional deposition of copper occurs. The electrical current can be applied immediately upon immersion of the work-piece in the electroless solution or at any time thereafter, but, for non-conductive substrates, no current flow or additional depositing will be realized until sufficient copper is electrolessly deposited from the solution onto the substrate by chemical reduction.

The method of U.S. Pat. No. 4,459,184 is quite useful in certain applications for building up thick copper deposits while still retaining advantages inherent in non-autocatalytic systems. However, its utility lies largely in the area where work-pieces can be individually racked during the depositing process. Where multiple racking is employed, such as the parallel multiple racking commonly used when coating printed circuit boards, the portion of the process of U.S. Pat. No. 4,459,184 which is electrolytic can result in uneven current distribution, causing burning in areas of high current density and insufficient coverage in areas of low current density.

Another approach to obtaining thick deposits from non-formaldehyde electroless copper solutions employing hypophosphite reducing agents is disclosed in U.S. Pat. No. 4,265,943 in which the inherently non-autocatalytic solutions of U.S. Pat. No. 4,209,331 are rendered autocatalytic by inclusion therein of a source of noncopper ions (e.g., nickel and/or cobalt ions) which function as autocatalysis promoters for the metallic copper deposition. Since the electroless solution is autocatalytic, utility for the common multiple racking arrangement of printed circuit boards is attained. A very similar process is set forth in U.S. Pat. No. 4,482,596 in which autocatalytic electroless coatings consisting of alloys of copper, cobalt or nickel, and phosphorus are disclosed. The solution from which this alloy coating is deposited is simply an electroless, formaldehyde-free copper depositing solution employing a hypophosphite reducing agent and containing a source of nickel or cobalt ions of the type disclosed in U.S. Pat. No. 4,265,943. The use of a number of so-called "autocatalytic promoters" also is disclosed. Apparently the phosphorus content of the alloy coating is solely attributable to the phosphorus inherently incorporated during deposition as a consequence of the use of the standard hypophosphite reducing agent in the solution, since no other source of phosphorus (other than certain disfavored promoters) is disclosed.

The starting point for the present invention began with work involving the autocatalytic, formaldehyde-free electroless copper solutions of U.S. Pat. No. 4,265,943, i.e., those in which a non-copper ion (e.g., nickel or cobalt ion) is employed as the promoter which causes the otherwise non-autocatalytic solutions to be autocatalytic. As noted, the solutions of U.S. Pat. No. 4,265,943 are quite useful for the manufacture of printed circuit boards wherein a thin copper deposit is electrolessly applied to a multiple racking of suitably catalyzed substrates, followed by application of a mask or resist over the coated substrate to define a desired printed circuit pattern. The masked substrate is then further plated in an electrolytic bath to build up additional metal thickness in unmasked regions. The mask is then dissolved and the board placed in a suitable copper etchant solution to remove the thin copper layer previously covered by the mask while retaining the thicker regions built up during electroplating. For such processes, as demonstrated by the examples of U.S. Pat. No. 4,265,943 wherein various non-conductive ABS plastic and fiberglass-reinforced epoxy resin substrates are copper coated, the patented process and solutions are quite useful and workable.

U.S. Pat. No. 4,265,943 also discusses applicability of the process and solutions therein to "subtractive" procedures for making printed circuit boards. In these procedures, copper foil clad epoxy laminates are provided with punched or drilled "through-holes" for interconnecting conductor areas on opposite surfaces of the laminate. Since the walls of the through-holes are required to be coated with copper for conductivity, the process and solutions of the patent, notwithstanding acknowledged passivity to pure copper, theoretically were useful for electrolessly depositing copper on the walls of the through-holes, with any further build-up of copper on the laminate surface per se being accomplished in a subsequent electrolytic plating step.

Notwithstanding the projected utility of the process and solutions of U.S. Pat. No. 4,265,943 for coating through-holes with copper, such utility was not borne out in practice. Thus, when a copper foil clad epoxy laminate for printed circuit applications, having throughholes, and suitably catalyzed for electroless deposition, was immersed in a solution according to the patent (i.e., source of copper ion, hypophosphite reducing agent, source of nickel or cobalt, ion, complexing agent and pH adjustor), not only did no deposition occur on the copper clad surfaces, but no deposition occurred on the walls of the through-holes either.

Another most interesting finding made while working with the autocatalytic solutions of U.S. Pat. No. 4,265,943 was that, even as the wholly non-conductive surfaces which can be easily continuously coated with thick deposits of copper according to the patent, an interruption of the depositing operation, such as caused by the presence of a contaminant or a significant drop in operating temperature or an intentional or unintentional removal of the work-piece from the solution, results in a termination of deposition which cannot be re-commenced simply by correction or elimination of the interrupting factor and re-establishment of the originally operable processing conditions.

SUMMARY OF THE INVENTION

In accordance with the present invention, a method has been developed for overcoming the problems found with the autocatalytic, hypophosphite-based electroless copper solutions of the prior art, i.e., the inability to deposit copper therefrom onto a conductive surface such as copper, the inability to deposit copper therefrom onto suitably catalyzed non-conductive areas of a substrate having both non-conductive and conductive areas, and the inability to re-establish deposit of copper therefrom onto a work-piece which has been preliminarily coated with copper therefrom but in which the depositing operation was terminated or interrupted.

The method of the present invention involves the brief application of an electric current of negative potential to the particular work-piece in question so as to render it cathodic while immersed in the depositing solution, with completion of the electrical circuit being effected by arranging an anode in effective electrical contact with the solution. The required current flow between the cathodic work-piece and the anode is established by application of a potential from an external source such as a rectifier or other source of direct current. The electrical connection to the work-piece also can be made via a rack or fixture to which the work-piece is directly or indirectly attached or in contact.

The method of this invention is readily distinguishable from the earlier-discussed U.S. Pat. No. 4,459,184 by reason of the fact that the copper depositing solutions employed therin are non-autocatalytic in contrast to the inherently autocatalytic solutions used herein. Most importantly, the eletrical current used in the foregoing patent must be continuously applied after the preliminarily development of the thin non-autocatalytic copper coating on the work-piece in order to build up further thickness, and thus is in the nature of an electrolytic deposition (albeit using an electroless depositing solution). In contrast, the applied cathodic current of the invention is but briefly impressed, after which the autocatalytic deposition occurs and continues (or recommences and continues). Hence, the depositing method of the present invention is truly electroless in its coating function and not electrolytic.

Additional prior art teachings regarding the use of electrolytic current in conjunction with electroless plating are discussed in U.S. Pat. No. 4,459,184. Among these references and others are U.S. Pat. Nos. 2,644,787; 3,243,361; 3,264,199; 3,303,111; 3,485,725 and British Patent Specification No. 1,222,969.

In its broadest aspects, the present invention relates to a process for depositing copper in an electroless manner from an aqueous depositing solution containing a source of copper ions, a source of non-copper ions, such as cobalt or nickel ions, which act as autocatalysis promoters, a hypophosphite reducing agent, a complexing agent and an appropriate pH adjusting agent. The substrate upon which the copper is deposited is termed herein a conductive substrate, and this terminology is used to encompass the following specific situations and embodiments:

(a) a substrate (or work-piece) composed wholly of conductive material;

(b) a substrate composed of conductive or non-conductive material having a surface or surfaces bearing a conductive material (i.e., whether applied electrolytically, by means of electroless depositing, or otherwise); and (c) a substrate having portions composed of or bearing conductive material as well as portions composed of non-conductive material.

By way of example, one embodiment of this invention relates to the electroless deposition of copper from a solution of the type described to a substrate such as a copper clad epoxy printed circuit board having through-holes, the walls of which are composed simply of the epoxy material (as in (c) above). As earlier noted, the autocatalytic solutions of U.S. Pat. No. 4,265,943 and of the present invention have been found passive not only to the copper clad portions of such materials but also to the through-holes.

Another embodiment of the invention relates to the electroless deposition of copper from a solution of the type described to a substrate (e.g., non-conductive plastic) which has undergone some degree of electroless depositing from such an autocatalytic solution, but which depositing has been interrupted or terminated. At this point, the substrate is one bearing a conductive surface as in (b) above (from the electroless deposition of copper before interruption or termination), and the method of the present invention is useful for re-establishing or reactivating deposition upon this substrate.

BRIEF DESCRIPTION OF THE DRAWING

The invention will be better understood and its advantages will be more apparent from the following detailed description of the invention, especially when read in light of the accompanying drawing wherein FIG. 1 is a schematic depiction of apparatus for an electroless coating process.

DETAILED DESCRIPTION OF THE INVENTION

As earlier noted, the electroless depositing solutions to which the present invention relates are the formaldehyde-free, hypophosphite-reduced, autocatalytic electroless copper depositing solutions described in U.S. Pat. No. 4,265,943, the autocatalytic nature thereof being conferred by inclusion therein of a source of non-copper ions such as cobalt or nickel.

The disclosure of U.S. Pat. No. 4,265,943 is expressly incorporated herein by reference. Briefly, however, the depositing solution comprises a solvent, usually water, a source of cupric ions, a complexing agent, a non-formaldehyde reducing agent, i.e., soluble source of hypophosphite, a source of nickel or cobalt ions and, where required, a pH adjuster. The sources of copper, nickel and cobalt ions can be any soluble salts of these metals, with chlorides and sulphates preferred because of their ready availability.

The pH of the solution generally is at least 7 or above, and preferably is in the range of 11-14; attained and maintained through use of suitable acids, bases and, optionally, buffers.

The preferred source of hypophosphite is sodium hypophosphite because of its ready availability. Suitable complexing agents include the hydroxy acids and their metal salts such as the tartrates, gluconates, glycolates, lactates and the like, amine-type agents such as N-hydroxyethyl ethylenediamine triacetic acid (HEEDTA), ethylenediamine tetraacetic acid (EDTA) and the like. The solution optionally may also include unsaturated organic compound additives such as butynediol or butenediol, sodium alkyl sulfonates, and the like.

Where required, the substrates electrolessly coated with copper from these solutions are pretreated in a known manner (e.g., neutralization, conditioning, catalyzation with palladium-tin solutions, acceleration, intermediate water rinsing steps) in order to prepare the surfaces for electroless deposition.

In the process of the invention, the passivity of these otherwise autocatalytic solutions to conductive substrates, and particularly to (a) the pure copper clad on a non-conductive substrate such as used in printed circuit board manufacture, (b) the non-conductive through-hole walls or surfaces on such copper clad boards and (c) the copper coating resulting from electroless deposition using these solutions and after interruption or termination of such deposition, is overcome through brief application of cathodic current to the substrate or work-piece in question. The extent of such application (i.e., the voltage or current density and time duration) will vary dependent upon the solution being employed (concentration of active components, accumulation if any of decomposition products or contaminants and the presence of stabilizers or other additives) and the various operating parameters, such as temperature, agitation, loading factor, geometry of the work-piece and geometry of the plating tank.

The required activation voltage and time of application easily can be determined from each different set of conditions encountered. A convenient means for determining these parameters is through use of a millivoltmeter arranged between the work-piece and a standard calomel electrode, using a circuit such as schematically depicted in the drawing. The connection to the work-piece 5 may conveniently be made to the rack or fixture holding the work-piece(s) (not shown). The anode 4 used to complete the circuit can be any soluble or insoluble anode (e.g., copper, carbon graphite, stainles steel, platinized titanium).

When the work-piece 5 is first immersed in the solution 6 with rectifier 1 turned off, the potential reading of the milivoltmeter 3 generally will be between about $-200$ and $-550$ mV. As the rectifier voltage is increased, the negative potential in respect of the standard electrode 2 also will increase. When the potential reaches about $-1300$ mV, the rectifier can be switched off and the deposition will then continue autocatalytically with the potential dropping to a steady state between about $-1100$ to about $-1200$ mV.

The initiation time can be quite short. For example, for an applied rectifier voltage of 1.6 V, the potential will reach $-1300$ mV in about five (5) seconds.

The millivoltmeter can be a standard commercial high impedance analog or digital millivoltmeter or even a pH meter operated in a millivolt mode. In place of the standard calomel electrode, a silver-silver chloride reference electrode can be used, provided the assymetry potential of about 50 mV is compensated for.

The depositing potential can be monitored continuously by a millivoltmeter and, if a control function is added to the circuit, a relay may be made to automatically switch on a cathodic current for a few seconds to reestablish appropriate potentials. For example, a workload may be operating at a steady state of about $-1100$ mV, but decreasing slowly. When the voltage drops to below $-1050$ mV, passivation can take place abruptly with the voltage dropping to $-350$ mV. The control set point can be chosen to be about $-1050$ mV to reinitiate deposition for a few seconds.

In contrast to electolytic processes or combined electroless/electrolytic processes, current density is not a useful control factor in the present invention since the area of the work does not determine the amount of current drawn at a given cell voltage. In a typical printed circuit board electroless copper installation, the boards are racked in parallel about ½ inch apart. The panels can be quite large (e.g., 18 inches by 24 inches) and stacked to as many as 50 per rack. In an electrolytic installation, virtually all of the current would be drawn by the two end panels facing the anodes and only the outer edges of the remaining boards. This current distribution in such a case would result in areas of high current density where a granular, burned useless deposit would result and areas of low current density having an insufficient deposit of metal. For this reason, in normal practice, the boards are re-racked individually after electroless plating and before electrolytic plating so that both sides of each board will face the anodes.

The present invention, however, does not encounter such difficulties. The voltage required for initiation or re-initiation of depositing is on the order of about 1 to 2 volts. The initial current density is about 2.5 amperes per square foot, but drops to about 0.4 ASF within a few seconds. It is theorized that the high current density areas polarize within this short time allowing the low current density areas to draw proportionally more current than they would in a conventional electrolytic process.

The invention is further described with reference to the following illustrative examples.

EXAMPLE 1

An autocatalytic electroless copper depositing solution was prepared containing the following ingredients dissolved in water: 1.5 g/l. copper in the form of copper sulfate, 7.7 g/l. sodium hydroxide, 17 g/l. sodium hypophosphite, 50 ppm cobalt in the form of cobalt chloride, 100 ppm butynediol, and as complexing agents, Rochelle salts in slight stoichiometric excess over the copper concentration.

The bath temperature was adjusted to 105° F. and subjected to mild air agitation.

A precleaned and etched copper clad epoxy printed circuit board with through-holes was catalyzed by immersion in a palladium-tin solution in a manner which normally would be expected to render the surfaces thereof receptive to deposition. The so-treated board was then immersed in the bath, which also contained a stainless steel anode. No metal was deposited onto the board or the walls of the through-holes.

The positive terminal of a plating rectifier was connected to the stainless steel anode in the depositing tank and the negative terminal to the printed circuit board. A millivoltmeter was then connected to the printed circuit board using a standard calomel electrode as a counter electrode. With the rectifier off, a reading of $-340$ mV was recorded. The rectifier was then turned on and the voltage increased until the cell potential across the printed circuit board and counter electrode was $-1400$ mV. Metal deposition occurred shortly thereafter (approximately one minute, evidenced by visible hydrogen gas evolution at the cathode). The current was turned off after one minute and metal deposition continued electrolessly. After thirty minutes, 100 microinches of copper had been deposited.

EXAMPLE 2

Using the method and work-piece of Example 1, electroless deposition was allowed to continue for 15 minutes. After 15 minutes, deposition was interrupted by removing the work-piece from the bath for a fews seconds. The work-piece was then re-immersed in the bath. No metal deposition occurred and the copper on the work-piece turned a brown color. Upon adjusting the voltage to $-1400$ mV according to the method of Example 1 until gassing occurred (10 seconds), the work-piece was reactivated and electroless plating continued after the current was turned off until bath components were depleted. When the current was turned off, the potential dropped from $-1400$ mV to $-1180$ mV and remained substantially the same for the duration of electroless deposition.

EXAMPLE 3

A copper clad epoxy printed circuit board with through-holes was subjected to the bath and method of Example 1. While electroless plating was occurring, the temperature of the bath was allowed to drop to 70° F. The millivoltmeter reading was $-350$ mV at 70° F. bath temperature, and metal deposition stopped suddenly. The bath was reheated to 105° F., but no metal deposition occurred. Reactivation was accomplished according to the method of Example 2 and electroless plating continued until bath components were depleted.

EXAMPLE 4

A copper clad epoxy printed circuit board with through-holes was subjected to the bath and method of Example 1. The millivoltmeter reading stabilized at $-1180$ mV after the current was turned off. After the bath had been active for 15 minutes, 30 ppm of tin was added to the bath as a contaminant. The potential changed rapidly from $-1180$ mV to $-350$ mV indicating cessation of plating. The printed circuit board was removed from the bath, rinsed with water and immersed in a new, uncontaminated bath which had been prepared according to Example 1. The millivoltmeter was attached to the printed circuit board and the calomel electrode according to Example 1. The potential was adjusted to $-1400$ mV according to the method of Example 2. The work-piece was reactivated and electroless plating continued after the current was turned off until bath components were depleted.

Other contaminants which could "kill" an electroless copper bath are tin and/or lead from 10 to 30 ppm, cyanide, divalent sulfur compounds and thiocyanate at less than 1 ppm. These baths are irreversibly poisoned by these contaminants and need to be discarded. However, as a result of the present invention, the work-pieces could be saved by early detection of a contamination problem and reimmersed in a non-contaminated bath before copper oxidation occurs. This would be especially useful in a larger installation where several electroless plating lines would be in operation.

EXAMPLE 5

A copper clad epoxy printed circuit board with through-holes was subjected to the bath and method of Example 1. Electroless plating was allowed to continue without replenishment of bath components. Plating stopped when bath components were depleted below minimum operating needs as indicated by a sudden change in potential from $-1180$ mV to $-350$ mV. The work-piece was removed from the bath, reimmersed in another bath prepared according to Example 1, reactivated according to Example 2 and electroless plating continued. The depleted bath was then checked for depleted components and replenished for use.

EXAMPLE 6

Eight 4"×4" copper clad epoxy printed circuit boards with through-holes were racked in parallel 1/16" apart on a rack capable of conducting current. The attachments were made according to Example 1 and the drawing except that the negative terminal of the rectifier and the millivoltmeter were attached to the rack instead of to the single printed circuit board. The printed circuit boards were subjected to the bath and method of Example 1. After 30 minutes plating time, copper deposition thickness on the boards ranged from 101 to 115 microinches with an average thickness of 109 microinches.

EXAMPLE 7

A suitably cleaned and etched standard commercial plating grade ABS panel was subjected to the bath of Example 1. Electroless plating commenced without the initiation of Example 1. After 15 minutes plating time, the panel was removed from the bath for a few seconds. Upon reimmersion in the bath, no metal deposition occurred. The panel was reactivated according to the method of Example 2, and electroless deposition commenced and continued until bath components were depleted.

EXAMPLE 8

A steel panel, 0.030 inches × 3 inches × 4 inches, was cleaned by conventional metal finishing means and immersed in the solution of example 1. No metal deposition took place. The electric currrent was then turned on and adjusted until the millivoltmeter indicated $-1400$ millivolts. After 30 seconds the rectifier was turned off and the deposition continued until the panel was removed after 30 minutes. Examination showed that the copper thickness was 100 micro-inches and the adhesion was good.

As the foregoing examples demonstrate, the method of the present invention can be employed to great advantage not only to effect electroless plating on an otherwise passive substrate ab initio, but also to re-initiate deposition on a substrate which, while of the type in which the autocatalytic solutions of the type used herein would continue to deposit copper thereon indefinitely assuming proper solution replenishment, passivates by reason of some interruption or termination of operation.

Although for purposes of illustration the examples generally employ solutions which are not replenished, it will be apparent that the rquired degree of ingredient replenishment will be conducted (generally automatically) in accordance with the deposited metal thickness requirements.

As noted earlier, the required voltage and time duration of cathodic current application will vary with varying operating and solution parameters, but generally initiation time will be less than one minute and the voltage will be between about 1 to 2 volts. The potential between the actively plating work-piece and a standard calomel electrode generally will be between about $-1100$ and mV and $-1400$ mV, and typically between about $-1220$ mV and $-1180$ mV. Marginal solutions generally are indicated by a potential of $-1150$ mV to $-1050$ mV, at which point abrupt passivation (to about $-350$ mV) can occur.

Continued application or maintenance of potential from the external source is not per se detrimental, but is not economic. A distinct advantage of the present invention is that deposition will continue after cessation of the briefly impressed applied potential. As used herein, the "brief" application of potential and resultant cathodic current is for that period of time whereafter cessation thereof will nevertheless be accompanied by continuation of deposition/plating.

Typical operating solution temperatures will be in the range of from about 100° F. to 120° F.

The foregoing description and examples have been used to illustrate the important features of the invention but are not to be taken as a limitation of its scope or applicability. Modifications may be made to particular conditions and components specifically disclosed for adaption to particular requirements, without departing from the scope and spirit of the invention as defined by the appended claims.

What is claimed is:

1. A method for electrolessly depositing a coating comprised of copper on the non-conductive surfaces of through-holes present in a printed circuit board base material comprised of a non-conductive substrate clad with copper, said method comprising:
    (a) contacting said base material with a palladium/tin activating solution so as to provide on said through-hole surfaces species catalytic to said electroless deposition;
    (b) immersing said base material of (a) in an aqueous solution comprising a soluble source of copper ions, a soluble source of non-copper ions selected from the group consisting of cobalt ions, nickel ions and mixtures thereof, a complexing agent and a soluble source of hypophosphite ions;
    (c) applying an electric current of negative potential to said base material to render it cathodic while immersed in said aqueous solution;
    (d) completing an electrical circuit by placing an anode in effective electrical contact with said aqueous solution; and
    (e) maintaining said applied potential for a brief duration effective to initiate electroless deposition of a coating comprised of copper from said aqueous solution onto the catalyzed non-conductive surfaces of said through-holes, which deposition continues autocatalytically after removal of said applied potential.

2. The method according to claim 1 wherein the applied potential is maintained for a time effective to establish a cell potential between said base material and a standard calomel electrode of at least about $-1100$ millivolts.

3. The method according to claim 1 wherein said non-conductive substrate consists essentially of epoxy material.

4. In a method for electrolessly depositing a coating comprised of copper on the surface of a substrate, wherein said substrate is immersed in an autocatalytic aqueous solution comprising a soluble source of copper ions, a soluble source of non-copper ions selected from the group consisting of cobalt ions, nickle ions and mixtures thereof, a complexing agent and a soluble source of hypophosphite ions, for a time sufficient to provide at least a thin coating of electrolessly deposited copper on said surface, and whereafter said coated surface becomes passive to further coating, the improvement comprising re-establishing autocatalytic electroless deposition on said surface by:
    (a) arranging said substrate in an autocatalytic electroless depositing solution comprising an aqueous solution of a soluble source of copper ions, a soluble source of non-copper ions selected from the group consisting of cobalt ions, nickel ions and mixtures thereof, a complexing agent and a soluble source of hypophosphite ions under conditions otherwise effective for electroless depositing of copper on said surface to occur;

(b) thereafter applying an electric current of negative potential to said substrate to render it cathodic;

(c) completing an electrical circuit by having an anode in effective electrical contact with the solution; and (d) maintaining the applied potential for a brief duration effective to re-commence autocatalytic electroless deposition of copper from said solution onto said substrate, which deposition continues autoctalytically after removal of said applied potential.

5. The method according to claim 4 wherein said passivity results from termination of contact of said substrate with said autocatalytic electroless depositing solution.

6. The method according to claim 4 wherein said passivity results from a decrease in the operating temperature of the depositing solution, wherein said substrate is permitted to remain in said solution while suitable operating temperature is re-established therein and wherein said application of electric current of negative potential thereafter is commenced.

7. The method according to claim 4 wherein said passivity results from the presence of a contaminant in said depositing solution and wherein said substrate is thereafter removed from said contaminated solution and immersed in an uncontaminated autocatalytic electroless copper depositing solution followed by application of said electric current.

8. The method according to any one of claims 4, 5, 6 or 7 wherein the duration of said applied potential is effective to establish a cell potential between said substrate and a standard calomel electrode of at least about −1100 millivolts.

9. The method according to any one of claims 4, 5, 6 or 7 wherein the duration of said applied potential is effective to establish a cell potential between said substrate and a standard calomel electrode of at least about −1200 millivolts.

10. The method according to any one of claims 4, 5, 6 or 7 wherein said electrical current results from application to said circuit of a voltage of from 1 to 2 volts for a period of time of less than about one minute.

* * * * *